US012007413B2

(12) United States Patent
Yoshida et al.

(10) Patent No.: US 12,007,413 B2

(45) Date of Patent: Jun. 11, 2024

(54) PROBER CONTROLLING DEVICE, PROBER CONTROLLING METHOD, AND PROBER

(71) Applicant: Tokyo Seimitsu Co., Ltd., Tokyo (JP)

(72) Inventors: Tetsuo Yoshida, Tokyo (JP); Shunsuke Otake, Tokyo (JP); Tatsuya Matsuoka, Tokyo (JP)

(73) Assignee: TOKYO SEIMITSU CO., LTD., Tokyo (JP)

( * ) Notice: Subject to any disclaimer, the term of this patent is extended or adjusted under 35 U.S.C. 154(b) by 0 days.

(21) Appl. No.: 18/527,013

(22) Filed: Dec. 1, 2023

(65) Prior Publication Data

US 2024/0094254 A1 Mar. 21, 2024

Related U.S. Application Data

(63) Continuation of application No. PCT/JP2022/019630, filed on May 9, 2022.

(30) Foreign Application Priority Data

Jun. 4, 2021 (JP) ................................ 2021-094056

(51) Int. Cl.
*G01R 31/28* (2006.01)
*G01R 1/067* (2006.01)
(Continued)

(52) U.S. Cl.
CPC ....... *G01R 1/07307* (2013.01); *G01R 1/0675* (2013.01); *G01R 31/2887* (2013.01); (Continued)

(58) Field of Classification Search
None
See application file for complete search history.

(56) References Cited

U.S. PATENT DOCUMENTS

2007/0164770 A1 7/2007 Casler, Jr. et al.
2007/0268033 A1 11/2007 Fujita et al.
(Continued)

FOREIGN PATENT DOCUMENTS

CN 101996856 A 3/2011
CN 107078072 A 8/2017
(Continued)

OTHER PUBLICATIONS

Written Opinion PCT/JP2022/019630 (PCT/ISA/237) (Year: 2022).*
(Continued)

*Primary Examiner* — Paresh Patel
(74) *Attorney, Agent, or Firm* — Birch, Stewart, Kolasch & Birch, LLP

(57) ABSTRACT

A prober controlling device for bringing probe needles into contact with semiconductor chips, includes an input data acquiring unit configured to acquire input data including temperature data of at least one of a probe card and a card holder, a predicting unit configured to predict a position of a tip end of a probe needle based on the input data acquired by the input data acquiring unit, using a prediction model that receives input of the input data and outputs the position of the tip end of the probe needle, and a determining unit configured to determine whether or not to execute prediction by the predicting unit, based on input data used as teacher data for machine learning of the prediction model and the input data acquired by the input data acquiring unit, before the prediction by the predicting unit.

8 Claims, 9 Drawing Sheets

40
CONTROLLING UNIT
10
31
NEEDLE ALIGNMENT CAMERA
44
NEEDLE POSITION ACQUIRING UNIT
1
52
16
29
WAFER ALIGNMENT CAMERA
MOVEMENT CONTROLLING UNIT
X MOVING UNIT
X STAGE
15
Y MOVING UNIT
14
Y STAGE
13
Zθ MOVING UNIT
18
ZθSTAGE
17
46
48
PREDICTING UNIT
PREDICTION MODEL
47
PREDICTION MODEL GENERATING UNIT
1
39
STORAGE UNIT
56
2
DETERMINING UNIT
50
34
42
TEMPERATURE SENSOR
INPUT DATA ACQUIRING UNIT
38
ALIGNMENT DATA MEASURING UNIT

(51) Int. Cl.
*G01R 1/073* (2006.01)
*H01L 21/67* (2006.01)
*H01L 21/687* (2006.01)

(52) U.S. Cl.
CPC ..... *G01R 31/2889* (2013.01); *G01R 31/2891* (2013.01); *H01L 21/67248* (2013.01); *H01L 21/68707* (2013.01)

(56) References Cited

U.S. PATENT DOCUMENTS

| | | | | |
|---|---|---|---|---|
| 2008/0018352 | A1* | 1/2008 | Chiba ................ | G01R 31/2865 324/750.04 |
| 2015/0192616 | A1 | 7/2015 | Chen et al. | |
| 2017/0219625 | A1 | 8/2017 | Saiki et al. | |
| 2019/0064755 | A1 | 2/2019 | Ohmori et al. | |
| 2020/0096561 | A1 | 3/2020 | Fujihara | |
| 2020/0129043 | A1 | 4/2020 | Takayama et al. | |
| 2020/0166542 | A1 | 5/2020 | Watanabe | |
| 2020/0191830 | A1 | 6/2020 | Watanabe | |

FOREIGN PATENT DOCUMENTS

| | | | |
|---|---|---|---|
| CN | 110931390 | A | 3/2020 |
| CN | 111223786 | A | 6/2020 |
| CN | 111308302 | A | 6/2020 |
| CN | 112735967 | A | 4/2021 |
| JP | 1-92630 | A | 4/1989 |
| JP | 2005-228788 | A | 8/2005 |
| JP | 2006-173206 | A | 6/2006 |
| JP | 2007-311389 | A | 11/2007 |
| JP | 2009-524050 | A | 6/2009 |
| JP | 2018-117095 | A | 7/2018 |
| JP | 2019-47100 | A | 3/2019 |
| WO | WO 2019/008726 | A1 | 1/2019 |

OTHER PUBLICATIONS

International Search Report for PCT/JP2022/019630 (PCT/ISA/210) dated Jul. 19, 2022.

Chinese Office Action and Search Report for corresponding Chinese Application No. 202280039695.7 dated Mar. 28, 2024, with English translation.

* cited by examiner

10
W
20
20a
17
18
15
16
14
12
13
29
26
34
35
31
32
30
34
25a
25
Y
Z
X

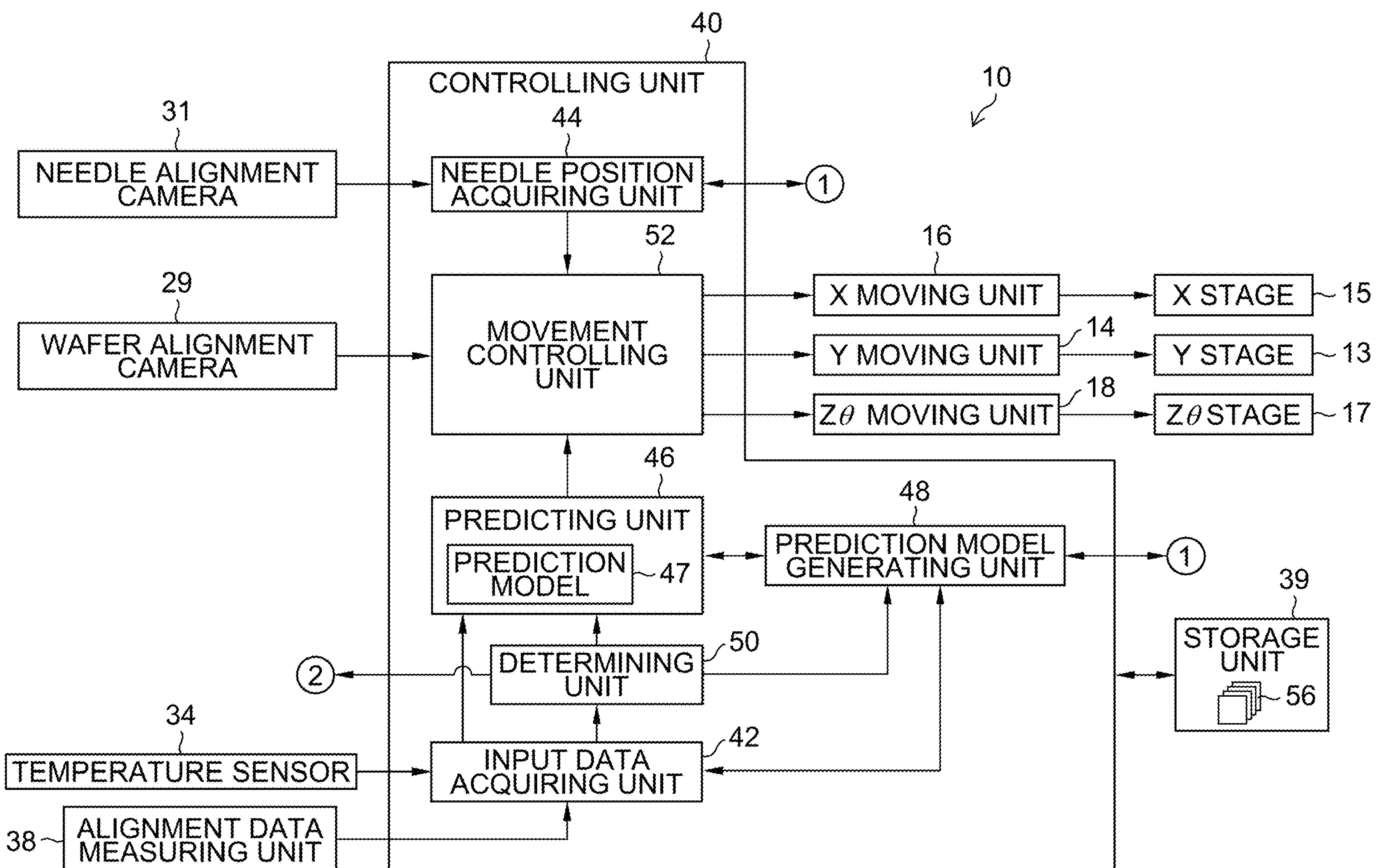
FIG.5
40
CONTROLLING UNIT
10
31
NEEDLE ALIGNMENT CAMERA
44
NEEDLE POSITION ACQUIRING UNIT
1
52
16
X MOVING UNIT
X STAGE
15
29
WAFER ALIGNMENT CAMERA
MOVEMENT CONTROLLING UNIT
14
Y MOVING UNIT
Y STAGE
13
18
Zθ MOVING UNIT
Zθ STAGE
17
46
PREDICTING UNIT
PREDICTION MODEL
47
48
PREDICTION MODEL GENERATING UNIT
1
39
STORAGE UNIT
56
50
2
DETERMINING UNIT
34
TEMPERATURE SENSOR
42
INPUT DATA ACQUIRING UNIT
38
ALIGNMENT DATA MEASURING UNIT FIG.8
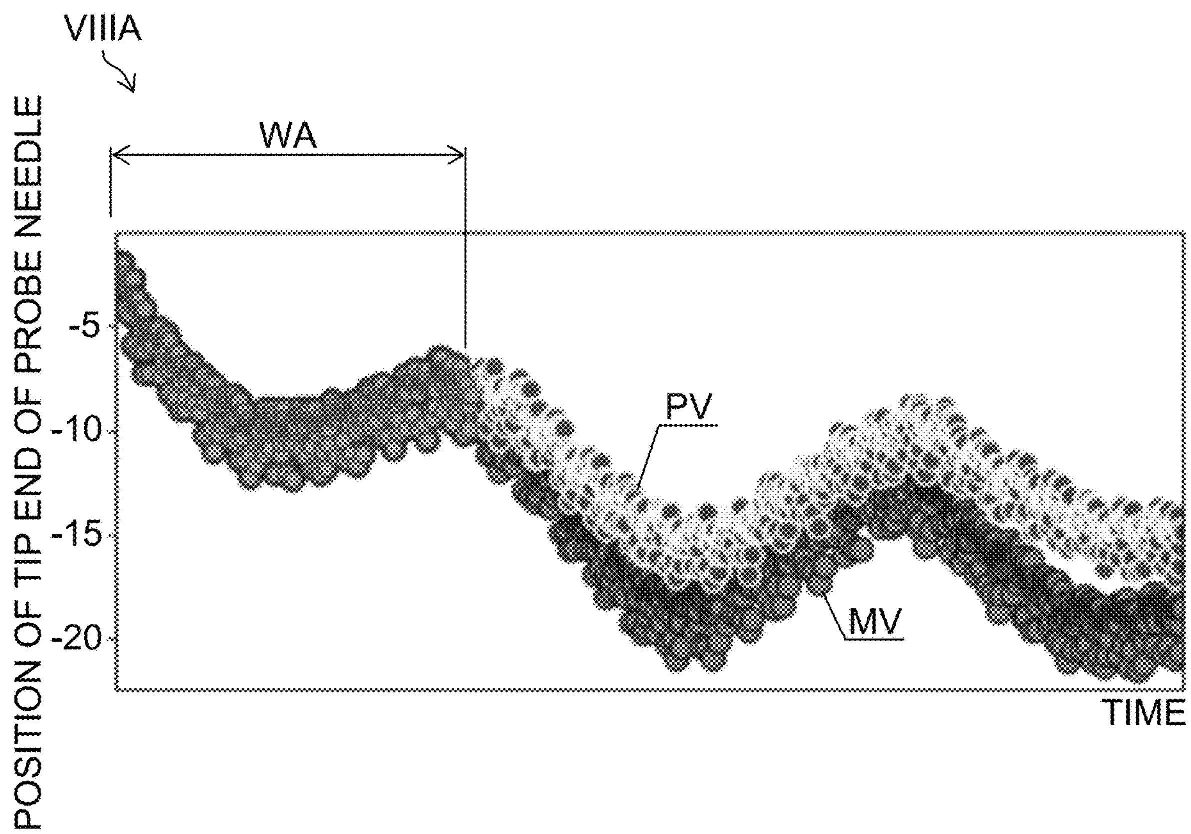
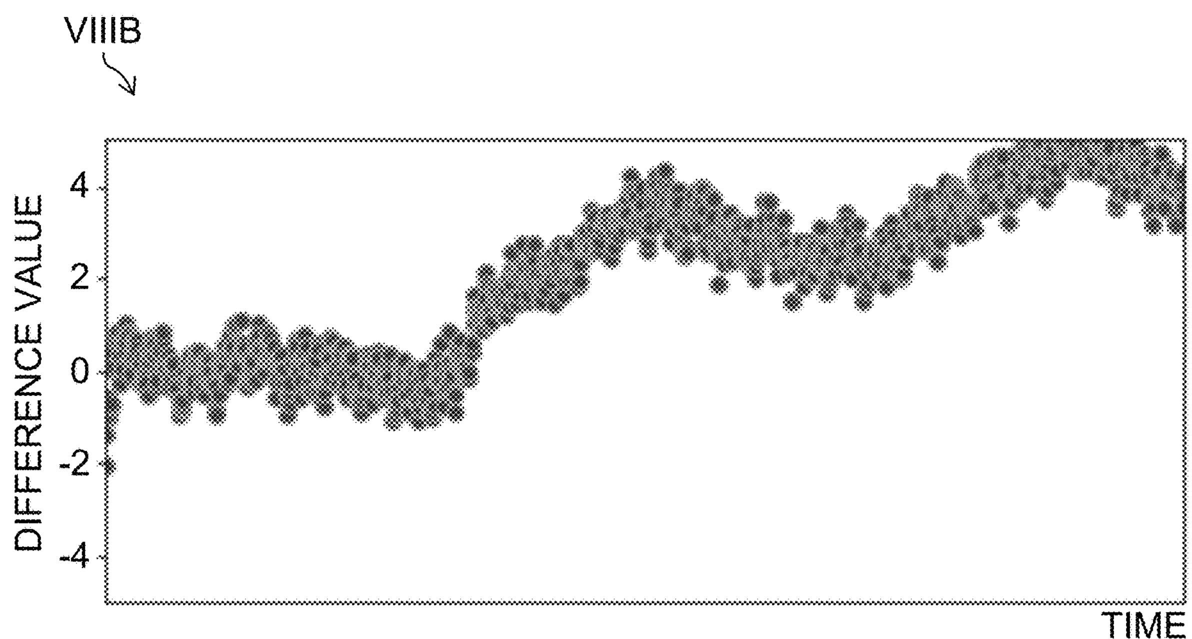

FIG.9
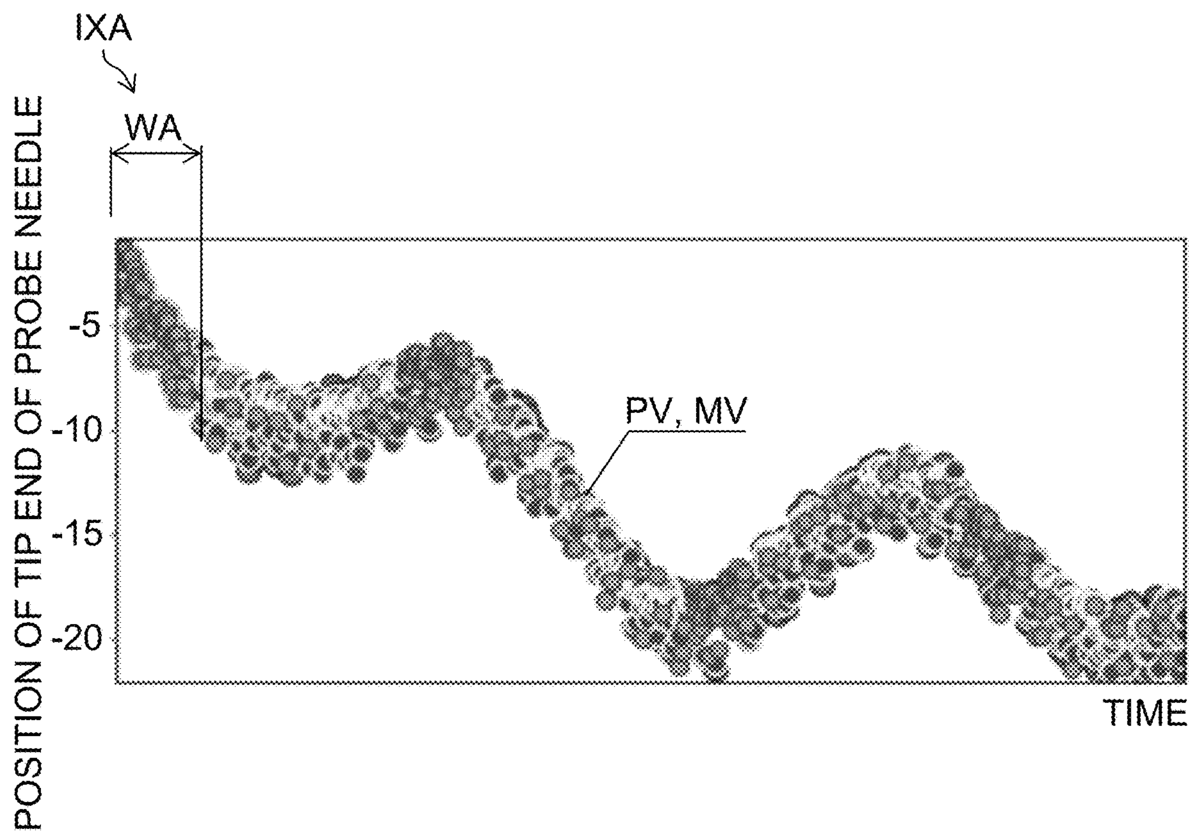
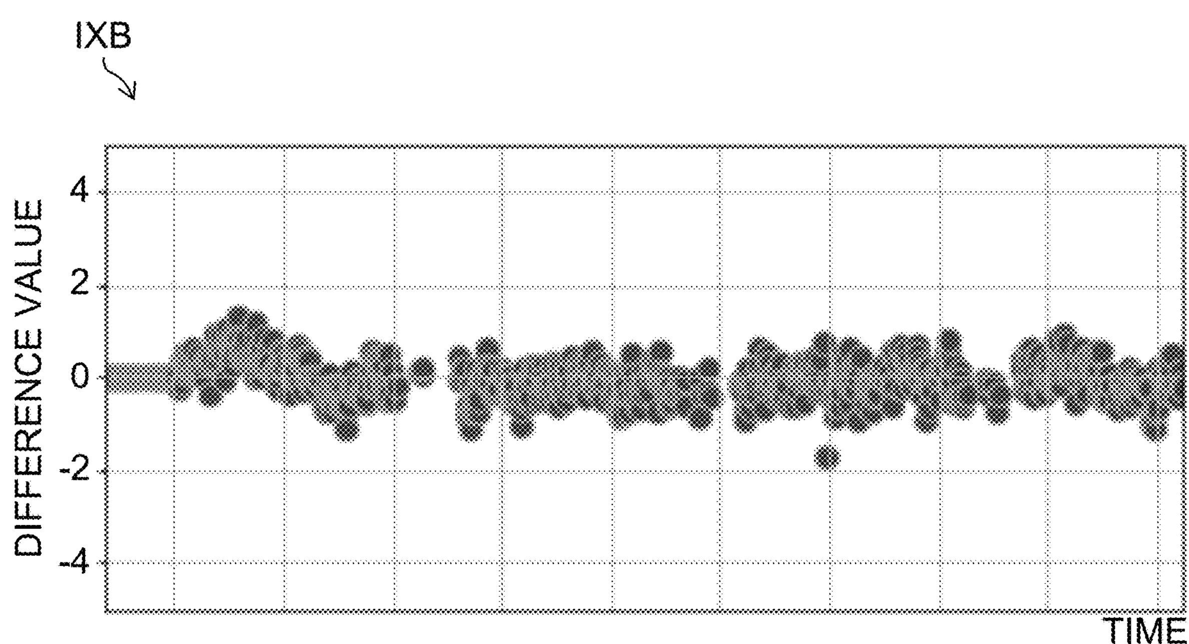

PROBER CONTROLLING DEVICE, PROBER CONTROLLING METHOD, AND PROBER

CROSS-REFERENCE TO RELATED APPLICATIONS

The present application is a Continuation of PCT International Application No. PCT/JP2022/019630 filed on May 9, 2022 claiming priority under 35 U.S.C § 119(a) to Japanese Patent Application No. 2021-094056 filed on Jun. 4, 2021. Each of the above applications is hereby expressly incorporated by reference, in their entirety, into the present application.

BACKGROUND OF THE INVENTION

Field of the Invention

The present invention relates to a prober controlling device for a prober which is used to inspect electric characteristics of semiconductor chips formed on a wafer, a prober controlling method for a prober, and a prober.

Description of the Related Art

Semiconductor chips including identical electric circuit elements are formed on a surface of a wafer. Electric characteristics of each semiconductor chip are inspected by a wafer test system before the wafer is diced into pieces per semiconductor chip by a dicer. The wafer test system includes a prober and a tester (refer to Patent Literatures 1 to 4).

In a state where the wafer is held on a wafer chuck, the prober moves the wafer chuck relative to a probe card having probe needles so as to bring the probe needles into electrical contact with electrode pads of respective semiconductor chips. The tester supplies various test signals to each semiconductor chip through a terminal connected to the probe needle, and receives and analyzes signals output from the semiconductor chip to test whether the semiconductor chip normally operates.

Semiconductor chips are used in a wide usage range and in a wide temperature range. Thus, inspection of a semiconductor chip needs to be performed at, for example, room temperature (ordinary temperature), high temperature, and low temperature. Thus, the wafer chuck of the prober is provided with a temperature adjusting unit such as a heater mechanism, a chiller mechanism, or a heat pump mechanism. The wafer held on the wafer chuck is heated or cooled by the temperature adjusting unit.

In this case, the temperature of any other component than the wafer chuck of the prober gradually changes to approach the temperature of the wafer chuck. Accordingly, the component deforms through thermal expansion due to heating or contraction due to cooling, and the relative positions between the probe needle and the semiconductor chip also change along with the deformation. As a result, when the probe needle and the wafer are relatively moved to perform inspection of the semiconductor chip, a probing failure in which the probe needle does not correctly contact with the semiconductor chip, may occur.

Thus, Japanese Patent Application Laid-Open No. 2006-173206 (hereinafter referred to as "Patent Literature 1") discloses a prober in which a temperature sensor is attached to a probe card having probe needles so as to correct the height position of a wafer chuck based on a result of measurement by the temperature sensor when the probe needle and a semiconductor chip are brought into contact with each other. In the prober disclosed in Patent Literature 1, a relation between the temperature of the probe card and the displacement amount of the probe needle in the height direction is obtaining in advance so that a correction amount of the height position of the wafer chuck can be determined based on a result of measurement by the temperature sensor.

Japanese Patent Application Laid-Open No. 2005-228788 (hereinafter referred to as "Patent Literature 2") discloses a prober which has a temperature sensor at a probe card and an X direction moving stage, and brings a probe needle into contact with a semiconductor chip in a state where the temperature at a predetermined site of the prober is stable based on a result of measurement by the temperature sensor. With the prober disclosed in Patent Literature 2, it is possible to shorten a preheat time in which a wafer, the probe card and the like are heated in advance.

Japanese Patent Application Laid-Open No. 2007-311389 (hereinafter referred to as "Patent Literature 3") discloses a prober in which a temperature sensor is attached to each of a wafer chuck, a card holder configured to hold a probe card, and a head stage configured to hold the card holder, so as to correct the contact position between a probe needle and a semiconductor chip based on a result of measurement by each temperature sensor. In the prober of Patent Literature 3, a relation between the temperature of each of the wafer chuck and the card holder and the position of the probe needle is obtained in advance to generate a prediction model that indicates position change of the probe needle along with change of each temperature. Accordingly, the prober of Patent Literature 3 can correct the contact position between the probe needle and the semiconductor chip by referring to the prediction model based on a result of temperature measurement by each temperature sensor.

Japanese Patent Application Laid-Open No. 2018-117095 (hereinafter referred to as "Patent Literature 4") discloses a prober which measures temperature of both a probe card and a card holder, and predicts a position of the tip end of a probe needle based on results of the temperature measurement of the probe card and the card holder by referring to a prediction model that indicates a relation between the temperatures of the probe card and the card holder, and the position of the tip end of the probe needle displaced due to thermal deformation of the probe card and the card holder. With the prober disclosed in Patent Literature 4, it is possible to efficiently and stably bring the probe needle into contact with a semiconductor chip.

CITATION LIST

- Patent Literature 1: Japanese Patent Application Laid-Open No. 2006-173206
- Patent Literature 2: Japanese Patent Application Laid-Open No. 2005-228788
- Patent Literature 3: Japanese Patent Application Laid-Open No. 2007-311389
- Patent Literature 4: Japanese Patent Application Laid-Open No. 2018-117095

SUMMARY OF THE INVENTION

In each of the above-described probers disclosed in Patent Literatures 3 and 4, the prediction model is generated in advance. When the prediction model is generated while the temperature in the prober is not stable, for example, right after temperature change in the wafer chuck, deviation occurs between a predicted value of the position of the tip end of the probe needle by the prediction model and a measured value of the position of the tip end of the probe needle. As a result, a probing failure may occur. Thus, in this case, generation (training) of the prediction model needs to be continued for a long time until the temperature in the prober is stabilized.

Furthermore, even in a case of using a prediction model generated while the temperature in the prober is stable, deviation may occur between the predicted value and measured value of the position of the tip end of the probe needle when a temperature sensor is drifted due to elapse of a long time or when the position of the tip end of the probe needle is displaced due to temperature variation at a place where temperature measurement is not performed in the prober.

The present invention has been made in view of the above-described problems and aims to provide a prober controlling device, a prober controlling method, and a prober that can more accurately predict a position of the tip end of a probe needle.

To achieve the objective of the present invention, a prober controlling device for a prober including a wafer chuck configured to hold a wafer on which semiconductor chips are formed, a probe card having probe needles, a card holder configured to hold an outer periphery of the probe card and place the probe card opposite the wafer and a relative moving unit configured to move the wafer chuck relatively to the probe needles, the prober controlling device being configured to drive the relative moving unit to bring the probe needles into contact with the semiconductor chips, the prober controlling device includes: an input data acquiring unit configured to acquire input data including temperature data of at least one of the probe card and the card holder; a predicting unit configured to predict a position of a tip end of a probe needle based on the input data acquired by the input data acquiring unit using a prediction model that receives input of the input data and outputs the position of the tip end of the probe needle; and a determining unit configured to determine whether or not to execute prediction by the predicting unit, based on input data used as teacher data for machine learning of the prediction model and the input data acquired by the input data acquiring unit, before the prediction by the predicting unit.

The prober controlling device may determine, before the prediction by the predicting unit, whether or not the prediction model used for the prediction can accurately predict the position of the tip end of the probe needle based on the current input data.

In the prober controlling device according to another aspect of the present invention, the determining unit performs: processing of calculating, for respective parameters of the input data, differences between the input data acquired by the input data acquiring unit and the input data used as the teacher data; and processing of calculating root sum squares of the differences for respective parameters, and determining whether or not to execute the prediction by the predicting unit based on whether or not at least one of the root sum squares of the differences for respective parameters is in a predetermined certain range.

The prober controlling device according to another aspect of the present invention, further includes: a needle position acquiring unit configured to acquire the position of the tip end of the probe needle in a case in which the determining unit determines not to execute the prediction; and a relearning unit configured to perform relearning of the prediction model using the teacher data to which the input data acquired by the input data acquiring unit and the position of the tip end of the probe needle acquired by the needle position acquiring unit are added. In the prover controlling device, the needle position acquiring unit, the relearning unit, the input data acquiring unit and the determining unit are repeatedly operated until the determining unit determines to execute the prediction. Accordingly, the position of the tip end of the probe needle can be accurately predicted.

In the prober controlling device according to another aspect of the present invention, the relearning unit excludes, from the teacher data, an oldest input data and the position of the tip end of the probe needle corresponding to the oldest input data, and then executes relearning of the prediction model based on the teacher data. Accordingly, it is possible to reduce influence of drift of the input data acquiring unit (temperature sensor).

In the prober controlling device according to another aspect of the present invention, in a case in which the determining unit determines to execute the prediction, the predicting unit predicts the position of the tip end of the probe needle, and the prober controlling device further includes a movement controlling unit configured to control the relative moving unit based on the position of the tip end of the probe needle predicted by the predicting unit, so as to bring the probe needle into contact with a semiconductor chip. Accordingly, the probe needle can be correctly brought into contact with the semiconductor chips.

In the prober controlling device according to another aspect of the present invention, the input data acquiring unit acquires, in addition to the temperature data as the input data, alignment data including at least one of: a chip size of a semiconductor chip, a position of the wafer, and a positional relation between a first camera used to detect the semiconductor chip and a second camera used to detect the probe needle.

To achieve the objective of the present invention, a prober includes: a wafer chuck configured to hold a wafer on which semiconductor chips are formed; a probe card having probe needles; a card holder configured to hold an outer periphery of the probe card and place the probe card opposite the wafer; a relative moving unit configured to move the wafer chuck relatively to the probe needles; and the above-described prober controlling device.

To achieve the objective of the present invention, a prober controlling method for a prober including a wafer chuck configured to hold a wafer on which semiconductor chips are formed, a probe card having probe needles, a card holder configured to hold an outer periphery of the probe card and place the probe card opposite the wafer and a relative moving unit configured to move the wafer chuck relatively to the probe needles, the prober controlling method of driving the relative moving unit to bring the probe needles into contact with the semiconductor chips, the prober controlling method includes: an input data acquiring step of acquiring input data including temperature data of at least one of the probe card and the card holder; a predicting step of predicting a position of a tip end of a probe needle based on the input data acquired in the input data acquiring step using a prediction model that receives input of the input data and outputs the position of the tip end of the probe needle; and a determining step of determining whether or not to execute the predicting step, based on input data used as teacher data for machine learning of the prediction model and the input data acquired in the input data acquiring step, before the predicting step.

The present invention can more accurately predict a position of a tip end of a probe needle.

BRIEF DESCRIPTION OF THE DRAWINGS

FIG. 5 is a functional block diagram illustrating functions of a controlling unit of the prober.

FIG. 8 illustrates a graph (refer to reference character VIIIA) showing a predicted value and a measured value of the position of the tip end of the probe needle, and a graph (refer to reference character VIIIB) showing a difference value between the predicted value and the measured value of the position of the tip end of the probe needle, in a comparative example in which determination by a determining unit and relearning of the prediction model are not executed.

FIG. 9 illustrates a graph (refer to reference character IXA) showing a predicted value and a measured value of the position of the tip end of the probe needle, and a graph (refer to reference character IXB) showing a difference value between the predicted value and the measured value of the position of the tip end of the probe needle, in the present embodiment.

DESCRIPTION OF THE EMBODIMENTS

[Configuration of Prober]

Figure 1:
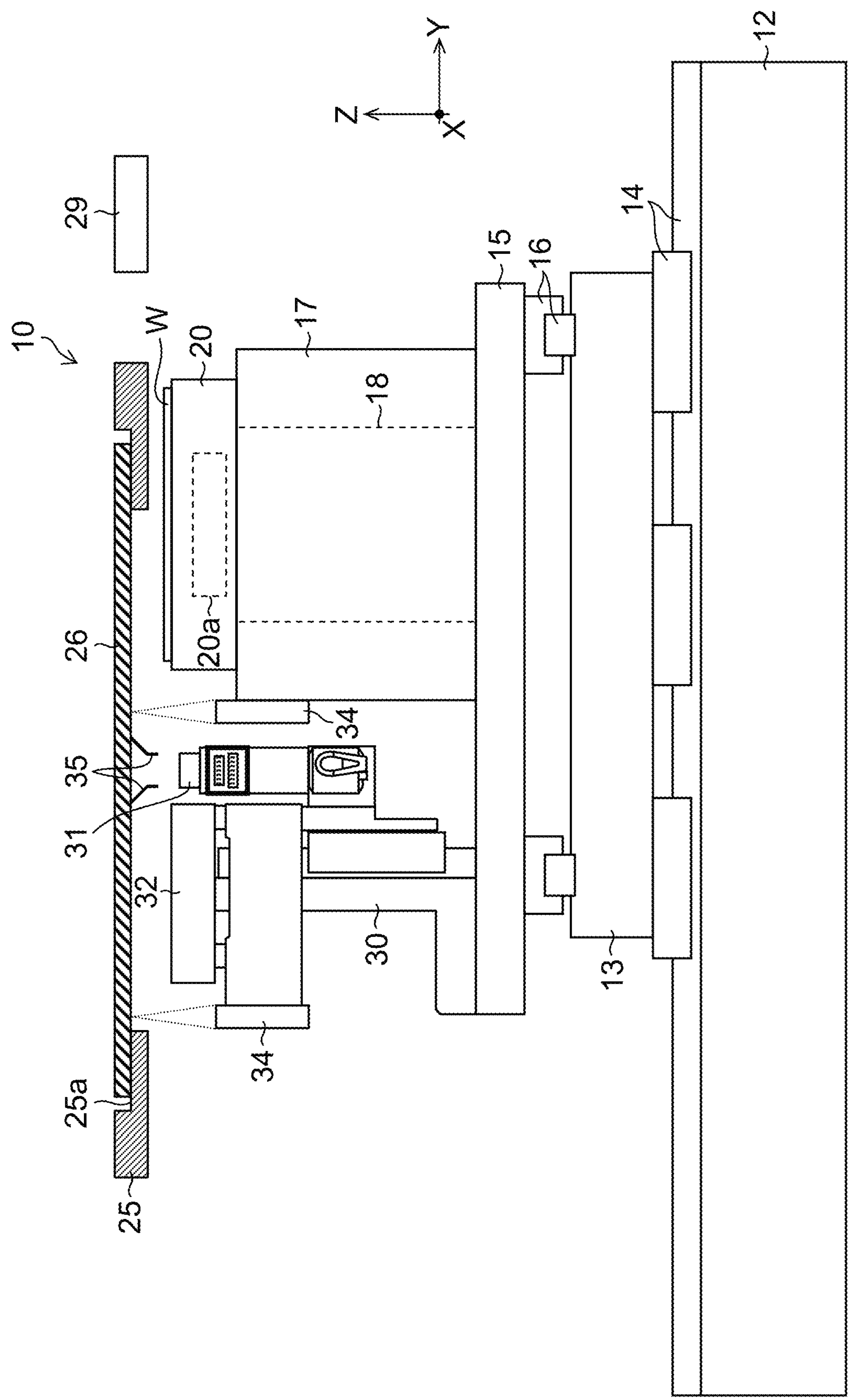
FIG. 1 is a schematic diagram of a prober used in a wafer test system which inspects electric characteristics of semiconductor chips formed on a wafer.
Figure 2:
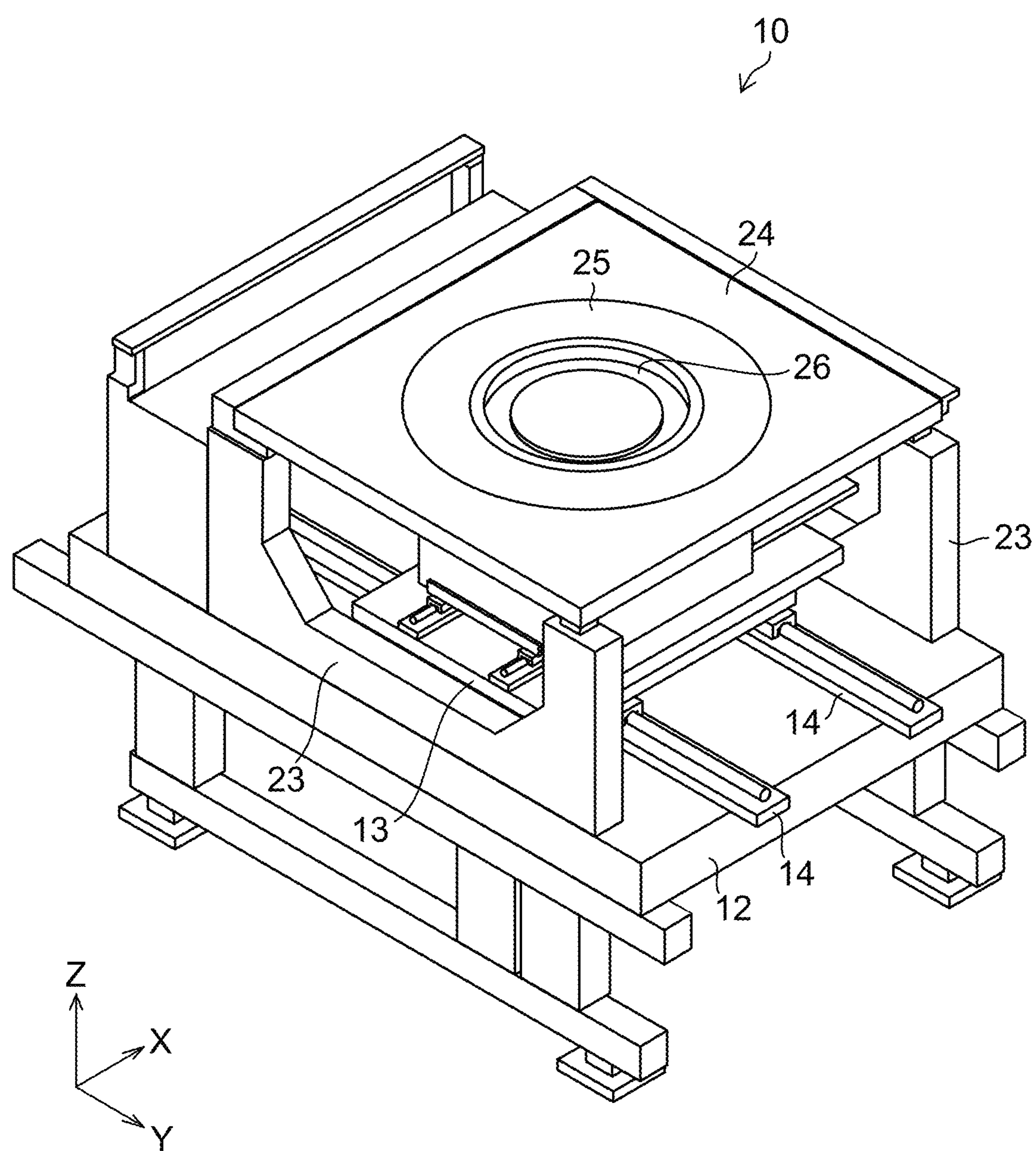
FIG. 2 is an external perspective view of the prober.

FIG. 1 is a schematic diagram of a prober 10 used in a wafer test system which inspects electric characteristics of semiconductor chips 9 (refer to FIG. 3) formed on a wafer W. FIG. 2 is an external perspective view of the prober 10.

As illustrated in FIGS. 1 and 2, the prober 10 includes a base 12, a Y stage 13, a Y moving unit 14, an X stage 15, an X moving unit 16, a ZO stage 17, a ZO moving unit 18, a wafer chuck 20, supports 23 (refer to FIG. 2), a head stage 24 (refer to FIG. 2), a card holder 25, a probe card 26, a wafer alignment camera 29, a lifting stage 30, a needle alignment camera 31, a cleaning plate 32, and temperature sensors 34. Note that an appearance configuration of the prober 10 is not limited to the example illustrated in FIGS. 1 and 2. The appearance configuration may be modified as appropriate.

The Y stage 13 is supported freely movably in a Y axis direction on an upper surface of the base 12 via the Y moving unit 14.

The Y moving unit 14 includes: a guide rail provided on the upper surface of the base 12 and extending in parallel to the Y axis; a slider provided on a lower surface of the Y stage 13 and engaged with the guide rail; and an actuator such as a motor configured to move the Y stage 13 in the Y axis direction, for example. The Y moving unit 14 moves the Y stage 13 on the base 12 in the Y axis direction.

The X stage 15 is supported freely movably in an X axis direction on an upper surface of the Y stage 13 via the X moving unit 16. The X moving unit 16 includes: a guide rail provided on the upper surface of the Y stage 13 and extending in parallel to the X axis; a slider provided on a lower surface of the X stage 15 and engaged with the guide rail; and an actuator such as a motor configured to move the X stage 15 in the X axis direction, for example. The X moving unit 16 moves the X stage 15 on the Y stage 13 in the X axis direction.

The Zθ stage 17 and the lifting stage 30 are provided on an upper surface of the X stage 15. The Zθ moving unit 18 is provided to the Zθ stage 17. The wafer chuck 20 is held on an upper surface of the Zθ stage 17 through the Zθ moving unit 18.

The Zθ moving unit 18 includes: an upward-downward moving mechanism configured to move the Zθ stage 17 in a Z axis direction (up-down direction); and a rotating mechanism configured to rotate the Zθ stage 17 about the Z axis, for example. Thus, the Zθ moving unit 18 moves the wafer chuck 20 held on the upper surface of the Zθ stage 17 in the Z axis direction and rotates the wafer chuck 20 about the Z axis.

The wafer W is held on an upper surface of the wafer chuck 20 by various holding methods such as vacuum suction. The wafer chuck 20 is provided with a temperature adjusting unit 20*a* for adjusting a temperature of the wafer W. The temperature adjusting unit 20*a* is a well-known mechanism such as a heater mechanism, a chiller mechanism and a heat pump mechanism. The temperature adjusting unit 20*a* adjusts the temperature of the wafer W held on the wafer chuck 20.

The wafer chuck 20 is supported freely movably in the XYZ axis directions and rotatably about the Z axis, through the Y stage 13, the Y moving unit 14, the X stage 15, the X moving unit 16, the Zθ stage 17 and the Zθ moving unit 18 described above. Thus, it is possible to move the wafer W held on the wafer chuck 20 relatively to probe needles 35 to be described later. That is, the Y stage 13 and the Y moving unit 14, the X stage 15 and the X moving unit 16, and the Zθ stage 17 and the Zθ moving unit 18 function as a relative moving unit of the present invention.

Figure 3:
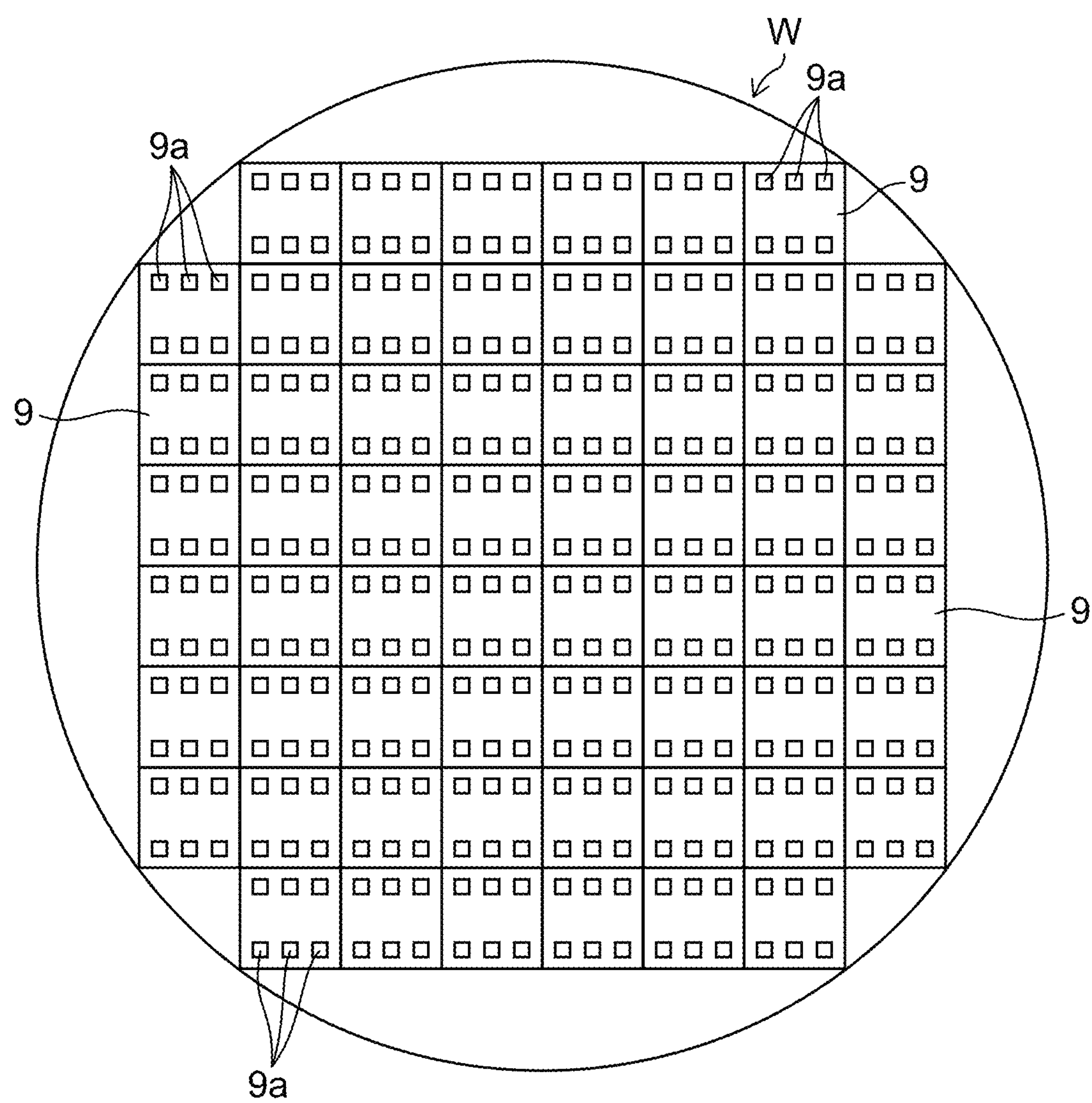
FIG. 3 is a top view of the wafer held by a wafer chuck.

FIG. 3 is a top view of the wafer W held on the wafer chuck 20. As illustrated in FIG. 3, the semiconductor chips 9 are formed on the wafer W. Electrode pads 9*a* are formed on each semiconductor chip 9.

Back in FIGS. 1 and 2, the supports 23 are provided on the upper surface of the base 12. The supports 23 support the head stage 24 at a position above the Y stage 13, the X stage 15, and the Zθ stage 17 (hereinafter simply referred to as the stages 13, 15, and 17). Thus, the head stage 24 is fixed above the base 12 through the supports 23.

The card holder 25 is held at a central part of the head stage 24. A holding hole 25*a* for holding an outer periphery of the probe card 26 is formed on the card holder 25. The probe card 26 is held on the holding hole 25*a*. Thus, the probe card 26 is held at a position facing the wafer W through the head stage 24 and the card holder 25.

The probe card 26 includes probe needles 35 disposed in accordance with disposition of the electrode pads 9*a* on a semiconductor chip 9 to be inspected, and so on. The card holder 25 and the probe card 26 are changed depending on types of the semiconductor chip 9.

The probe card 26A is provided with connection terminals (not illustrated) which are electrically connected to the probe needles 35, and a tester (not illustrated) is connected to the connection terminals. The tester supplies various test signals to the electrode pads 9*a* of each semiconductor chip 9 through the connection terminals of the probe card 26 and the probe needles 35, and receives and analyzes signals output from the electrode pads 9*a* to inspect whether the semiconductor chip 9 normally operates. Note that the configuration of the tester and a test method are publicly known technologies, and thus detailed description thereof is omitted.

The wafer alignment camera 29 corresponds to a first camera of the present invention. The wafer alignment camera 29 captures an image of semiconductor chips 9 on the wafer W held by the wafer chuck 20. The position of each electrode pad 9*a* on a semiconductor chip 9 to be inspected can be detected based on the image captured by the wafer alignment camera 29. Note that an installation position and a structure of the wafer alignment camera 29 are not particularly limited. In the present embodiment, the installation position and the structure (irradiation optical system for spot light) with which the wafer alignment camera 29 can measure a relative distance to the needle alignment camera 31 to be described later, are employed as disclosed in Japanese Patent Application Laid-Open No. 2003-303865.

The needle alignment camera 31 and the cleaning plate 32 are provided on the lifting stage 30 at positions substantially facing the head stage 24 and the like. The lifting stage 30 includes an upward-downward moving mechanism (not illustrated) that is freely movable in the Z axis direction so that the positions of the needle alignment camera 31 and the cleaning plate 32 in the Z axis direction are adjustable. Note that the needle alignment camera 31 and the cleaning plate 32 are supported freely movable in the XYZ axis directions through the Y stage 13 and the Y moving unit 14, the X stage 15 and the X moving unit 16, and the lifting stage 30. With this configuration, the needle alignment camera 31 and the cleaning plate 32 are relatively movable with respect to the probe needles 35.

The needle alignment camera 31 corresponds to a second camera of the present invention and captures an image of the probe needles 35 of the probe card 26. The position of the probe needles 35 can be detected based on the image of the probe needles 35 captured by the needle alignment camera 31. Specifically, the XY coordinates of the position of the tip end of the probe needles 35 are detected based on the position coordinates of the needle alignment camera 31, and the Z coordinate of the position of the tip end of the probe needles 35 is detected based on the focal position of the needle alignment camera 31.

In a case in which the semiconductor chips 9 on the wafer W are inspected with the prober 10 having the above-described configuration, the stages 13, 15, and 17 are driven to relatively move the needle alignment camera 31 to the position of image capturing of the probe needles 35 to capture an image of the probe needles 35 by the needle alignment camera 31 each time the probe card 26 is replaced or each time a predetermined number of semiconductor chips 9 are inspected. The position of the tip end of the probe needles 35 is detected as described above based on the image captured by the needle alignment camera 31.

In addition, while the wafer W to be inspected is held on the wafer chuck 20, the stages 13, 15, and 17 are driven to relatively move the wafer alignment camera 29 to the position of image capturing of the wafer W to capture an image of the semiconductor chips 9 on the wafer W by the wafer alignment camera 29. The positions of the electrode pads 9*a* of each semiconductor chip 9 to be inspected are detected based on the image captured by the wafer alignment camera 29.

Then, the stages 13, 15, and 17 are driven to cause the probe needles 35 to electrically contact the electrode pads 9*a* of a semiconductor chip 9 to be inspected first. In this state, inspection of the semiconductor chip 9 to be inspected first is executed by the non-illustrated tester. Subsequently, inspection of the remaining semiconductor chips 9 to be inspected is executed in the same manner. Note that the specific method of examining the semiconductor chips 9 is a publicly known technology, and thus specific description thereof is omitted (refer to Patent Literature 4, for example).

The temperature sensors 34 are provided at positions facing lower surfaces of the card holder 25 and the probe card 26, for example, on a side surface of the Zθ stage 17 and a side surface of the lifting stage 30, respectively. Thus, each temperature sensor 34 is held freely movable relative to the card holder 25 and the probe card 26 by the stages 13, 15, 17, and 30.

The temperature sensors 34 are, for example, non-contact temperature sensors using a radiant energy detecting method and measure the temperatures of the card holder 25 and the probe card 26 in a non-contact manner. The card holder 25 and the probe card 26 thermally deform under influence of the temperature of the wafer chuck 20, and the positions of the tip ends of the probe needles 35 are displaced along with the thermal deformation. Thus, it is possible to predict the positions of the tip ends [displacement (displacement direction and displacement amount)] of the probe needles 35 by measuring the temperatures of the card holder 25 and the probe card 26 using the temperature sensors 34 (refer to Patent Literature 4).

Figure 4:
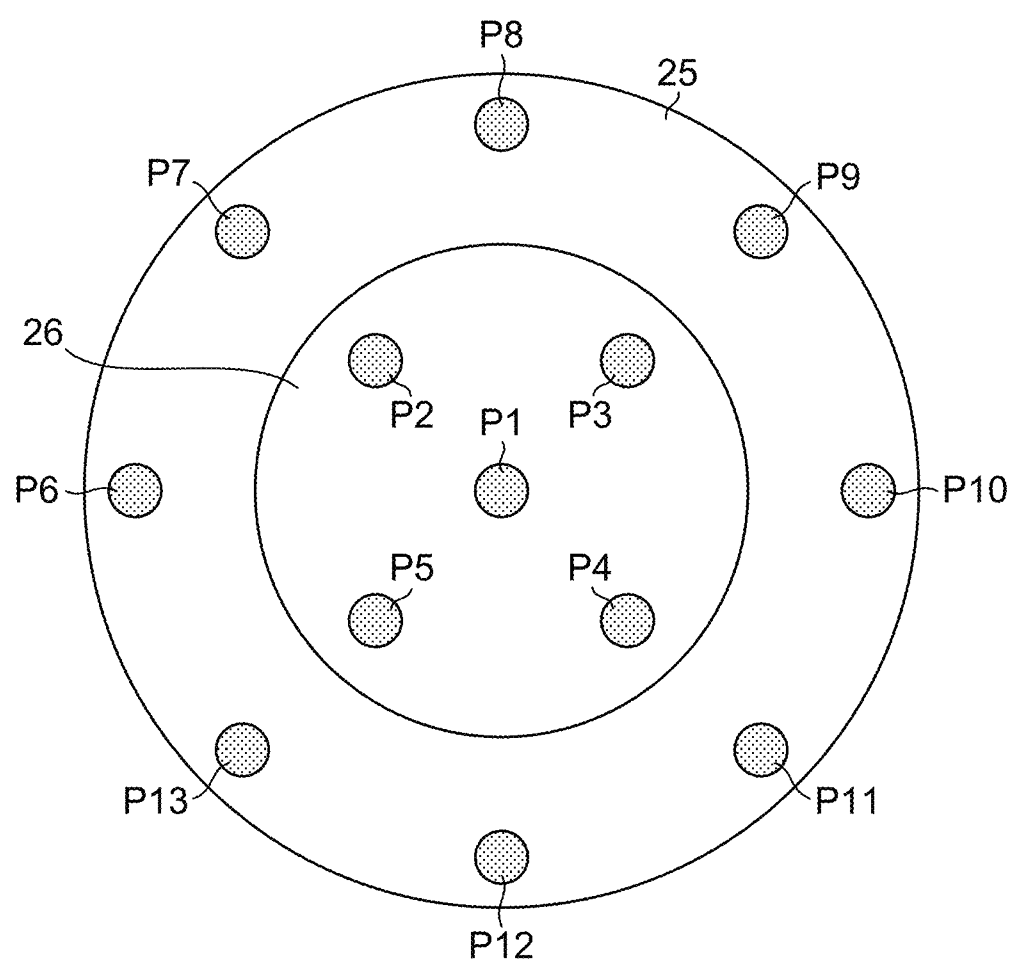
FIG. 4 is an explanatory diagram illustrating an example of temperature measurement points on a card holder and a probe card by temperature sensors.

FIG. 4 is an explanatory diagram illustrating an example of temperature measurement points on the card holder 25 and the probe card 26 by the temperature sensors 34. Note that illustration of the probe needles 35 is omitted in FIG. 4. As illustrated in FIG. 4, to detect temperature distribution of the card holder 25 and the probe card 26, the temperature sensors 34 measure the temperatures of the card holder 25 and the probe card 26 at points including temperature measurement points P1 to P5 on the probe card 26 and temperature measurement points P6 to P13 on the card holder 25. Note that the temperature measurement points P1 to P13 in FIG. 4 are exemplary and the positions and the number of the temperature measurement points may be changed as appropriate.

Under control of a controlling unit 40 (refer to FIG. 5) to be described later, the temperature sensors 34 perform temperature measurement on the temperature measurement points P1 to P13 and output temperature data as results of the temperature measurement to the controlling unit 40. Note that, when measuring temperatures on the temperature measurement points P1 to P13, the stages 13, 15, 17, and 30 are driven, in other words, the temperature sensors 34 are moved relatively to the card holder 25 and the probe card 26 under control of the controlling unit 40 to be described later so that the temperature sensors 34 are placed at positions where the temperature sensors 34 can measure the temperatures on the temperature measurement points P1 to P13. Accordingly, fixed-point measurement of the temperatures on the temperature measurement points P1 to P13 can be performed.

<Functions of Controlling Unit>

FIG. 5 is a functional block diagram illustrating functions of the controlling unit 40 of the prober 10. Note that FIG. 5 only illustrates functions related to contact control between the probe needles 35 and the wafer W (the electrode pads 9*a* of each semiconductor chip 9) among functions of the controlling unit 40, and omits illustration of the other functions because they are publicly known technologies.

As illustrated in FIG. 5, the controlling unit 40 corresponds to a prober controlling device of the present invention and collectively controls components of the prober 10.

Note that the controlling unit 40 may be built in the body of the prober 10 or may be provided separately from the body.

The controlling unit 40 is configured by an arithmetic device such as a personal computer and includes a calculation circuit constituted by various processors, memories, and the like. Examples of the various processors include a central processing unit (CPU), a graphics processing unit (GPU), an application specific integrated circuit (ASIC), and a programmable logic device [for example, a simple programmable logic device (SPLD), a complex programmable logic device (CPLD), or a field programmable gate array (FPGA)]. Note that various kinds of functions of the controlling unit 40 may be implemented by one processor or may be implemented by processors of the same kind or different kinds.

The controlling unit 40 is connected through various communication interfaces (not illustrated) to the wafer alignment camera 29, the needle alignment camera 31, the temperature sensors 34 and the like, and is also connected to an alignment data measuring unit 38 and a storage unit 39.

The alignment data measuring unit 38 measures alignment data by controlling the wafer alignment camera 29, the needle alignment camera 31, and the like. The alignment data is data used together with the above-described temperature data to predict the position of the tip end (displacement) of the probe needles 35. The alignment data includes, for example, the three-dimensional chip size of each semiconductor chip 9 to be inspected, the three-dimensional position of the wafer W, and the three-dimensional relative distance (hereinafter simply referred to as a camera relative distance) between the wafer alignment camera 29 and the needle alignment camera 31. Note that the camera relative distance indicates the positional relation between the wafer alignment camera 29 and the needle alignment camera 31.

Specifically, the alignment data measuring unit 38 measures the chip size (expansion amount) of each semiconductor chip 9 based on an image of the wafer W (semiconductor chip 9) captured by the wafer alignment camera 29. The alignment data measuring unit 38 also measures the position of the wafer W based on an image of a specific pattern (not illustrated) of each semiconductor chip 9 captured by the wafer alignment camera 29. In addition, the alignment data measuring unit 38 measures the camera relative distance using the wafer alignment camera 29, the needle alignment camera 31, and an optical system (not illustrated) configured to irradiate the wafer W with spot light, as disclosed in Japanese Patent Application Laid-Open No. 2003-303865. Then, the alignment data measuring unit 38 outputs, to the controlling unit 40, the alignment data including the chip size of each semiconductor chip 9, the position of the wafer W, and the camera relative distance.

The storage unit 39 stores a control program (not illustrated) for operating the controlling unit 40, and results of inspection of semiconductor chips 9 by the prober 10, and in addition, teacher data 56 (also referred to as training data) used for machine learning of a prediction model 47 to be described later.

When inspecting a semiconductor chip 9 to be inspected in the wafer W, the controlling unit 40 functions as an input data acquiring unit 42, a needle position acquiring unit 44, a predicting unit 46, a prediction model generating unit 48, a determining unit 50, and a movement controlling unit 52 by executing the control program (not illustrated) read from the storage unit 39.

Both before contact control for bringing the probe needles 35 into contact with the semiconductor chip 9 to be inspected (hereinafter simply referred to as "before contact control") and before generation or relearning of the prediction model 47 to be described later, the input data acquiring unit 42 executes measurement of the temperatures on the temperature measurement points P1 to P13 by the temperature sensors 34 and measurement of the alignment data by the alignment data measuring unit 38. Accordingly, at each of the timings, the input data acquiring unit 42 acquires input data including the temperature data on the temperature measurement points P1 to P13 from the temperature sensors 34 and the alignment data from the alignment data measuring unit 38.

The input data acquiring unit 42 outputs the input data acquired before contact control, to the predicting unit 46 and the determining unit 50 to be described later. In addition, the input date acquiring unit 42 outputs the input data acquired before generation or relearning of the prediction model 47, to the prediction model generating unit 48 to be described later.

After replacement of the probe card 26, after inspection of a predetermined number of semiconductor chips 9, and before generation or relearning of the prediction model 47 to be described later, the needle position acquiring unit 44 executes image capturing of the probe needles 35 by the needle alignment camera 31 to acquire the captured image of the probe needles 35 from the needle alignment camera 31, and acquires the positions of the tip ends of the probe needles 35 based on the captured image.

The needle position acquiring unit 44 outputs the positions of the tip ends of the probe needles 35 acquired before generation or relearning of the prediction model 47, to the prediction model generating unit 48 to be described later. Further, the needle position acquiring unit 44 outputs the positions of the tip ends of the probe needles 35 acquired, for example, after replacement of the probe card 26, to the movement controlling unit 52 to be described later.

The predicting unit 46 predicts the positions of the tip ends of the probe needles 35 before contact control and when the determining unit 50 to be described later determines that prediction by the predicting unit 46 is "to be executed". Specifically, the predicting unit 46 refers to the prediction model 47 to be described later, which is generated in advance, based on the input data (the temperature data of the temperature measurement points P1 to P13 and the alignment data) to predict the positions of the tip ends of the probe needles 35 acquired by the input data acquiring unit 42, and outputs a prediction result of the positions of the tip ends to the movement controlling unit 52. Note that the positions of the tip ends of the probe needles 35 predicted by the prediction model 47 also includes a displacement amount (correction amount) from the position of the tip end of the probe needles 35 acquired by the needle position acquiring unit 44.

The prediction model 47 is a learned model generated through machine learning (supervised learning) with a multiple regression model (also referred to as multiple regression scheme or multiple regression analysis) by the prediction model generating unit 48 to be described later. The prediction model 47 receives pieces of input data (the temperature data of the temperature measurement points P1 to P13 and the alignment data) which are explanatory variables, and outputs a predicted value, which is an objective variable, of the positions of the tip ends of the probe needles 35.

The prediction model generating unit 48 generates the prediction model 47 before inspection of semiconductor chips 9 on a product wafer W. First, the prediction model generating unit 48 measures the teacher data 56 (the input data, the alignment data, and the positions of the tip ends of the probe needles 35) by using the product wafer W or a test wafer (wafer for prediction model production) W identical to the product wafer W.

Figure 6:
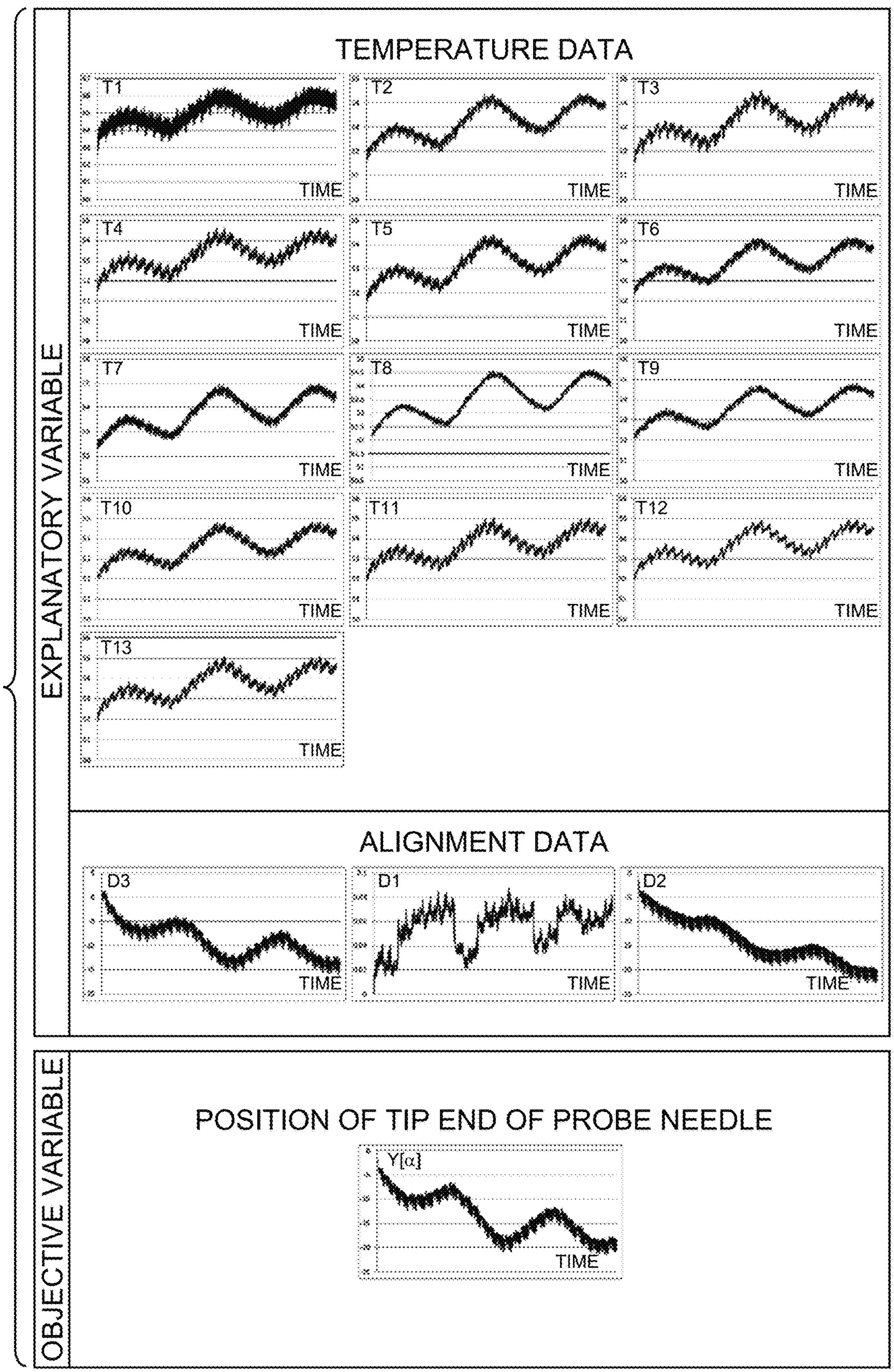
FIG. 6 is an explanatory diagram illustrating an example of teacher data used in machine learning of a prediction model by a prediction model generating unit.

FIG. 6 is an explanatory diagram illustrating an example of the teacher data 56 used for machine learning of the prediction model 47 by the prediction model generating unit 48. Note that, to avoid complication of the drawing, FIG. 6 exemplarily illustrates only the alignment data in one direction (in this example, the Y direction) among the X, Y, and Z directions, and the position of the tip end of the probe needle 35 in the one direction.

As illustrated in FIG. 6 and FIG. 5 described above, the prediction model generating unit 48 controlling the temperature sensors 34, the alignment data measuring unit 38, the movement controlling unit 52 to be described later and the like, to execute measurement of the input data (measurement of the temperatures on the temperature measurement points P1 to P13 and measurement of the alignment data) for a predetermined time period. Accordingly, temperature data T1 to T13 of the temperature measurement points P1 to P13 are obtained. In addition, a chip size D1 (change amount since the lot starts) of each semiconductor chip 9, a wafer position D2 (change amount since the lot starts) of the wafer W, and a camera relative distance D3 (change amount since the lot starts) are obtained as the alignment data.

The prediction model generating unit 48 controls the needle alignment camera 31, the needle position acquiring unit 44, the movement controlling unit 52 to be described later, and the like, to execute measurement of the position of the tip end of the probe needle 35 in accordance with the timing of the input data measurement. Accordingly, the position Y[α] of the tip end (α is an arbitrary natural number) of the probe needle 35 for each timing of the input data measurement is obtained.

In this manner, the prediction model generating unit 48 acquires the teacher data 56 including the input data and the position Y[α] of the tip end of the probe needle 35 corresponding to the input data. Note that, since relearning of the prediction model 47 can be performed in the present embodiment as described later in detail, it is required to acquire only the smallest number of the teacher data 56 necessary for machine learning of the prediction model 47. For example, in the present embodiment, the teacher data 56 is acquired using one wafer W.

Subsequently, the prediction model generating unit 48 generates the prediction model 47 for predicting the position of the tip end of the probe needle 35 based on the input data through machine learning with a multiple regression model, based on the teacher data 56, in other words, the input data (T1 to T13 and D1 to D3) as the explanatory variables and the position Y[α] of the tip end of the probe needle 35 as the objective variable. The specific method of generating the prediction model 47, in other words, the algorithm of machine learning using a multiple regression model is a publicly known technology, and specific description thereof is omitted. Accordingly, the predicting unit 46 can predict the current position of the tip end of the probe needle 35 based on the current input data.

Note that the algorithm of machine learning for generating the prediction model 47 is not limited to a multiple regression model but may be a well-known machine learning algorithm such as a convolutional neural network (CNN).

The prediction model generating unit 48 stores the teacher data 56 (or the input data only) used for machine learning of the prediction model 47 in the storage unit 39. The teacher data 56 stored in the storage unit 39 is used for determination by the determining unit 50 regarding whether or not to execute prediction by the predicting unit 46, to be described later.

As described later in detail, the prediction model generating unit 48 is operated to perform relearning of the prediction model 47 after generation of the prediction model 47 and when the determining unit 50 to be described later determines that prediction by the predicting unit 46 is "not to be executed".

Back in FIG. 5, the determining unit 50 is operated before contact control (before prediction by the predicting unit 46). The determining unit 50 compares the current (latest) input data acquired by the input data acquiring unit 42 and the input data of the teacher data 56 in the storage unit 39, and determines (simply referred to as "prediction execution determination") whether to execute prediction by the predicting unit 46 based on a result of the comparison.

In a case in which the current input data is not largely different from the input data of the teacher data 56 used for machine learning of the prediction model 47, the prediction model 47 is in a learned state (fitting state) in which the prediction model 47 has already been subjected to machine learning with the teacher data 56 corresponding to the current input data. Thus, when the position of the tip end of the probe needle 35 is predicted based on the current input data by using the prediction model 47, the predicting unit 46 can accurately predict the position of the tip end of the probe needle 35.

On the other hand, in a case in which the current input data is largely different from the input data of the teacher data 56, the prediction model 47 is in an unlearned state (underfitting state) in which the prediction model 47 has not been subjected to machine learning with the teacher data 56 corresponding to the current input data, yet. Thus, even when predicting the position of the tip end of the probe needle 35 by using the prediction model 47 in the unlearned state, the predicting unit 46 cannot accurately predict the position of the tip end of the probe needle 35.

Thus, the determining unit 50 performs prediction execution determination by comparing the current input data and the input data of the teacher data 56 in the storage unit 39, to determine whether the prediction model 47 is in the learned state or the unlearned state for the current input data.

First, the determining unit 50 calculates the difference between the current input data and the input data of the teacher data 56 for each parameter (the temperature data T1 to T13, the chip size D1, the wafer position D2, and the camera relative distance D3) of the input data. Subsequently, the determining unit 50 calculates the root sum of squares of the difference for each parameter and determines whether the prediction model 47 is in the learned state or the unlearned state based on whether at least one of the root sum squares for the parameters is in a certain range (equal to or smaller than a threshold value).

The method of determination by the determining unit 50 will be specifically described below. Note that, to avoid complication of description, it is assumed in the description that the input data is constituted only by the temperature data T1 to T13.

In a case in which the number of parameters of the input data is assumed to be m and the number of times of learning completion is assumed to be N, the learned input data (explanatory variables) is expressed by Expression [Math. 1] below. The learned position Y[α] (objective variable) of the tip end of the probe needle 35 is expressed by Expression [Math. 2] below. In addition, a function obtained by the algorithm of machine learning using a multiple regression model, in other words, the prediction model 47 is expressed by Expression [Math. 3] below.

$$\{X[1], \ldots, X[N]\} = \left\{ \begin{pmatrix} X_1[1] \\ X_2[1] \\ \vdots \\ X_m[1] \end{pmatrix}, \ldots, \begin{pmatrix} X_1[N] \\ X_2[N] \\ \vdots \\ X_m[N] \end{pmatrix} \right\} \quad \text{[Math. 1]}$$

$$\{Y[1], \ldots, Y[N]\} \quad \text{[Math. 2]}$$

$$Y = a_0 + \sum_{k=1}^{m} a_k X_k \quad \text{[Math. 3]}$$

In a case in which the "current input data" acquired at prediction of the position of the tip end of the probe needle 35 is represented by X[T] expressed in Expression [Math. 4] below, Euclidean distance D[s] between the current input data X[T] and X[s] that is an arbitrary s-th input data of the teacher data 56 is expressed by Expression [Math. 5] below.

$$X[T] = \begin{pmatrix} X_1[T] \\ X_2[T] \\ \vdots \\ X_m[T] \end{pmatrix} \quad \text{[Math. 4]}$$

$$D[s] = \sqrt{\sum_{k=1}^{m} (X_K[s] - X_K[T])^2} \quad \text{[Math. 5]}$$

The determining unit 50 compares each of the Euclidean distances D[s] (s=1, 2, . . . , N) with a predetermined threshold value $D_{th}$. In a case in which at least one Euclidean distance D[s] is smaller than the threshold value $D_{th}$, the determining unit 50 determines that the prediction model 47 (Expression [Math. 3]) is in the learned state, and determines that prediction by the prediction model 47 is to be executed. In this case, the predicting unit 46 predicts the position Y[T] of the tip end of the probe needle 35 as the objective variable, using the prediction model 47 expressed by Expression [Math. 3] based on the current input data X[T] as the explanatory variables.

In a case in which no Euclidean distance D[s] is smaller than the threshold value $D_{th}$, the determining unit 50 determines that the prediction model 47 is in the unlearned state, and determines that prediction by the prediction model 47 is not to be executed. In this case, when receiving an input of the determination result from the determining unit 50, the prediction model generating unit 48 functions as a relearning unit of the present invention so as to execute relearning of the prediction model 47.

When performing relearning of the prediction model 47, the prediction model generating unit 48 controls the needle position acquiring unit 44, the movement controlling unit 52 to be described later and the like, and acquires the position Y[T] of the tip end of the probe needles 35 which is the objective variable corresponding to the current input data X[T]. Here, the prediction model generating unit 48 may control the temperature sensors 34, the alignment data measuring unit 38, the movement controlling unit 52 and the like, and executes remeasurement of the input data.

Subsequently, the prediction model generating unit 48 generates new teacher data 56 by adding the current input data X[T] and the position Y[T] of the tip end of the probe needles 35 to the teacher data 56 in the storage unit 39. In this case, to reduce influence of drift of the temperature sensors 34, the prediction model generating unit 48 preferably excludes the oldest data (X[1], Y[1]) from the teacher data 56 (explanatory variables and objective variables) in the storage unit 39 as expressed in Expressions [Math. 6] and [Math. 7] below.

$$\{X[2], \ldots, X[N], X[T]\} = \left\{ \begin{pmatrix} X_1[2] \\ X_2[2] \\ \vdots \\ X_m[2] \end{pmatrix}, \ldots, \begin{pmatrix} X_1[N] \\ X_2[N] \\ \vdots \\ X_m[N] \end{pmatrix}, \begin{pmatrix} X_1[T] \\ X_2[T] \\ \vdots \\ X_m[T] \end{pmatrix} \right\} \quad \text{[Math. 6]}$$

$$\{Y[2], \ldots, Y[N], Y[T]\} \quad \text{[Math. 7]}$$

Then, the prediction model generating unit 48 executes machine learning with a multiple regression model based on the teacher data 56 stored in the storage unit 39, that is, the input data (explanatory variables) expressed in Expression [Math. 6] and the position of the tip end of the probe needles 35 (objective variable) expressed in Expression [Math. 7], to execute relearning of the prediction model 47. Accordingly, a new prediction model 47 (function) is obtained as expressed in Expression [Math. 8] below.

$$Y = b_0 + \sum_{k=1}^{m} b_k X_k \quad \text{[Math. 8]}$$

When relearning of the prediction model 47 is completed, prediction execution determination by the determining unit 50 is executed after acquisition of the input data by the input data acquiring unit 42.

Subsequently, until the determining unit 50 determines that prediction is to be executed, the needle position acquiring unit 44, the prediction model generating unit 48, the input data acquiring unit 42 and the determining unit 50 are repeatedly operated to repeatedly execute acquisition of the position of the tip end of the probe needles 35, updating of the teacher data 56 in the storage unit 39, relearning of the prediction model 47, acquisition of the input data and prediction execution determination. Accordingly, the predicting unit 46 can predict the position of the tip end of the probe needles 35 constantly using the prediction model 47 in the learned state.

The movement controlling unit 52 drives the stages 13, 15, and 17 through the Y moving unit 14, the X moving unit 16, and the Zθ moving unit 18. The movement controlling unit 52 acquires the positions of the semiconductor chips 9 (electrode pads 9*a*) to be inspected on the wafer W held on the wafer chuck 20 based on the captured image input from the wafer alignment camera 29. The movement controlling unit 52 also acquires the positions of the tip ends of the probe needles 35 (value measured when, for example, the probe card 26 is replaced) from the needle position acquiring unit 44.

When inspecting a product wafer W, the movement controlling unit 52 drives the stages 13, 15, and 17 to move the wafer W relatively to the probe needles 35 so that the probe needles 35 sequentially contact each semiconductor chip 9 to be inspected in the wafer W. In this case, the movement controlling unit 52 drives the stages 13, 15, and 17 based on a result of prediction of the positions of the tip ends of the probe needles 35 by the predicting unit 46, and corrects a contact position of each probe needle 35 with respect to the semiconductor chip 9, for each semiconductor chip 9 to be inspected. Accordingly, even when the position of the tip end of the probe needle 35 is displaced due to, for example, thermal deformation of the card holder 25 and the probe card 26, the probe needle 35 can contact each semiconductor chip 9 to be inspected at the corrected contact position corresponding to the position of the tip end after the displacement.

Effects of the Present Embodiment

Figure 7:
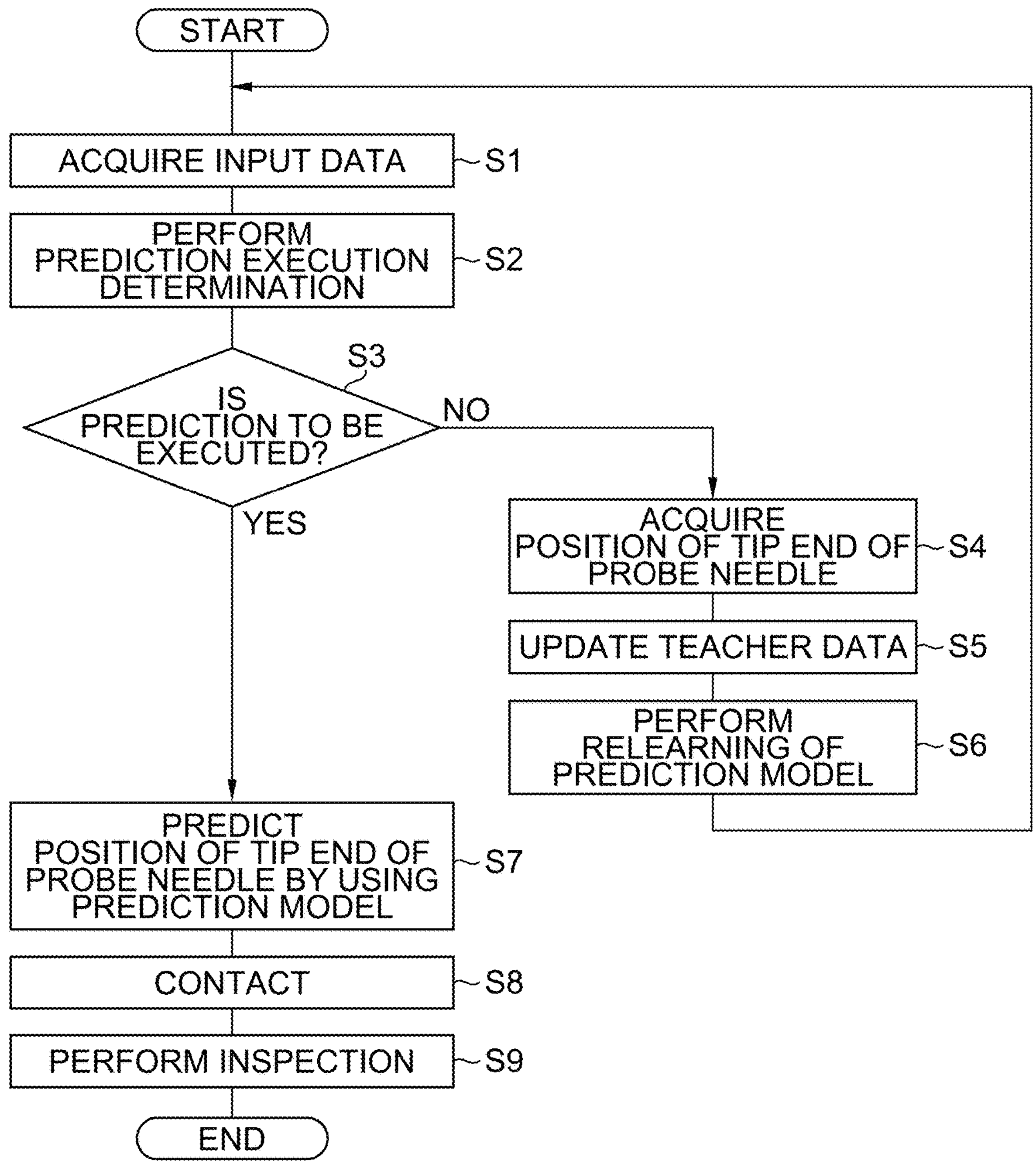
FIG. 7 is a flowchart illustrating the process of a method of bringing a probe needle into contact with a semiconductor chip by the prober.

FIG. 7 is a flowchart illustrating the process of a method of bringing the probe needle 35 into contact the semiconductor chip 9 by the prober 10 having the above-described configuration. The method corresponds to a prober controlling method of the present invention. In the description, it is assumed that the prediction model 47 is generated in advance, the teacher data 56 used for machine learning of the prediction model 47 is stored in the storage unit 39, and acquisition of the position of the tip end of the probe needle 35 by the needle position acquiring unit 44 has been already performed.

When a product wafer W is held on the wafer chuck 20, image capturing of semiconductor chips 9 on the wafer W is performed by the wafer alignment camera 29. Then, the movement controlling unit 52 determines the position of a semiconductor chip 9 (electrode pads 9*a*) to be inspected based on the image captured by the wafer alignment camera 29.

The input data acquiring unit 42 executes measurement of the temperatures of the temperature measurement points P1 to P13 by the temperature sensors 34 and measurement of the alignment data by the alignment data measuring unit 38. Accordingly, the input data acquiring unit 42 acquires the current input data including the temperature data of the temperature measurement points P1 to P13 and the alignment data (step S1; corresponding to an input data acquiring step of the present invention).

When the acquisition of the current input data is completed, the determining unit 50 is operated. The determining unit 50 compares the current input data acquired by the input data acquiring unit 42 and the input data of the teacher data 56 in the storage unit 39, to perform prediction execution determination (step S2; corresponding to a determining step of the present invention). Specifically, the determining unit 50 determines whether or not the prediction model 47 has completed learning with the current input data based on a result of comparison between each Euclidean distance D[s] (s=1, 2, . . . , N) expressed by Expression [Math. 5] and the threshold value $D_{th}$.

In a case in which the determining unit 50 determines that the prediction is not to be executed in the prediction execution determination (NO at step S3), the prediction model generating unit 48 acquires the position of the tip end of the probe needle 35 corresponding to the current input data by controlling the needle position acquiring unit 44, the movement controlling unit 52, and the like (step S4). Note that reacquisition of input data may be executed in this case.

Subsequently, the prediction model generating unit 48 updates the teacher data 56 by adding the current input data and the position Y of the tip end of the probe needle 35 to the teacher data 56 in the storage unit 39 and excluding the oldest data from the teacher data 56 as expressed in Expressions [Math. 6] and [Math. 7] above (step S5). Then, the prediction model generating unit 48 generates a new prediction model 47 by executing relearning of the prediction model 47 based on the new teacher data 56 in the storage unit 39 (step S6).

When the relearning of the prediction model 47 is completed, the input data acquiring unit 42 acquires input data again (step S2) and the determining unit 50 performs prediction execution determination based on the input data (step S3). Subsequently, the processing at steps S4 to S6, S1, and S2 is repeated until the determining unit 50 determines that prediction is to be executed.

In a case in which the determining unit 50 determines that prediction is to be executed (YES at step S3), the predicting unit 46 predicts the position of the tip end of the probe needle 35 by referring to the prediction model 47 based on the input data acquired at the latest step S1 (step S7; corresponding to a predicting step of the present invention). Then, the predicting unit 46 outputs a result of the prediction of the position of the tip end of the probe needle 35 to the movement controlling unit 52.

Subsequently, the movement controlling unit 52 controls movement of the stages 13, 15, and 17 based on the prediction result of the position of the tip end of the probe needle 35 input from the predicting unit 46 and the determined position of the semiconductor chip 9 to be inspected, so as to bring the probe needles 35 into contact with the semiconductor chip 9 to be inspected (step S8). After the contact, inspection of the semiconductor chip 9 is executed by the non-illustrated tester (step S9).

Subsequently, inspection is executed in the same manner for the remaining semiconductor chips 9 to be inspected. In this case, the processing at steps S1 to S7 may be repeatedly executed each time a predetermined number of semiconductor chips 9 are inspected or each time a predetermined time elapses.

Effects of the Present Embodiment

In the present embodiment as described above, the determining unit 50 performs prediction execution determination by comparing the current input data acquired before contact control and the input data of the teacher data 56. In a case in which the determining unit 50 determines that the prediction is not to be executed, relearning of the prediction model 47 is executed. Thus, the position of the tip end of the probe needle 35 can be more accurately predicted than in conventional cases.

FIG. 8 illustrates a graph (refer to reference character VIIIA) showing a predicted value PV and a measured value MV of the position of the tip end of the probe needle 35 and a graph (refer to reference character VIIIB) showing a difference value between the predicted value PV and the measured value MV of the position of the tip end of the probe needle 35, in a comparative example in which determination by the determining unit 50 and relearning of the prediction model 47 are not executed. FIG. 9 illustrates a graph (refer to reference character IXA) showing the predicted value PV and the measured value MV of the position of the tip end of the probe needle 35 and a graph (refer to reference character IXB) showing a difference value between the predicted value PV and the measured value MV of the position of the tip end of the probe needle 35 in the present embodiment.

Note that the graphs in FIGS. 8 and 9 illustrate temporal change of the predicted value PV and the measured value MV of the position of the tip end of the probe needle 35 in one arbitrary direction (in this example, the Y direction) among the X, Y, and Z directions and temporal change of the difference value between the predicted value PV and the measured value MV, in a state in which the temperature of the wafer chuck 20 is set to 200°. Reference character WA in FIGS. 8 and 9 designates a machine learning range in which machine learning is performed.

As illustrated in FIG. 8, in the comparative example, it is confirmed that, when drift of the temperature sensors 34 occurs or displacement of the position of the tip end of the probe needle 35 occurs along with temperature variation at a place where temperature measurement is not performed in the prober 10, deviation occurs between the predicted value PV and the measured value MV of the position of the tip end of the probe needle 35 and the difference value gradually increases in the machine learning range WA and later.

On the other hand, as illustrated in FIG. 9, in the present embodiment, it is confirmed that even in the machine learning range WA and later, the predicted value PV and the measured value MV of the position of the tip end of the probe needle 35 are substantially equal to each other and the difference value decreases, due to prediction execution determination by the determining unit 50 and relearning of the prediction model 47. Accordingly, in the present embodiment, even when drift of the temperature sensors 34 occurs or displacement of the position of the tip end of the probe needle 35 occurs along with temperature variation at a place where temperature measurement is not performed in the prober 10, it is possible to more accurately predict the position of the tip end of the probe needle by executing relearning of the prediction model 47.

Moreover, in the present embodiment, since relearning of the prediction model 47 is enabled, generation (machine learning) of the initial prediction model 47 does not need to be continued for a long time, and thus work taken for generation of the prediction model 47 can be reduced.

[Other]

The prediction model generating unit 48 performs both generation and relearning of the prediction model 47 in the above-described embodiment, but generation of the prediction model 47 may be performed at the manufacturer of the prober 10, another prober 10, or the like. In this case, a relearning unit configured to perform relearning of the prediction model 47 only may be provided in the controlling unit 40 in place of the prediction model generating unit 48.

The determining unit 50 performs prediction execution determination using Expression [Math. 5] in the above-described embodiment, but the method of the determination is not particularly limited. For example, it may be determined whether or not the current input data is included in the range (hereinafter referred to as a maximum-minimum range) between the maximum value and minimum value of the input data of the teacher data 56, for each parameter of the input data, and the prediction execution determination may be performed based on whether the current input data is included in the maximum-minimum range for all parameters.

The temperature data of the card holder 25 and the probe card 26, and the alignment data are measured as input data in the above-described embodiment, but only the temperature data may be measured. The temperature data of both of the card holder 25 and the probe card 26 is measured as input data in the above-described embodiment, but the temperature data of at least one of the card holder 25 and the probe card 26 may be measured. In addition, the chip size of each semiconductor chip 9, the position of the wafer W, and the camera relative distance are measured as the alignment data in the above-described embodiment, but at least one of them may be measured.

The temperature sensors 34 of a non-contact type are used in the above-described embodiment, but temperature sensors 34 of a contact type may be used.

REFERENCE SIGNS LIST

9: semiconductor chip, 9*a*: electrode pad, 10: prober, 12: base, 13: Y stage,
14: Y moving unit, 15: X stage, 16: X moving unit, 17: Zθ stage, 18: Zθ moving unit,
20: wafer chuck, 20*a*: temperature adjusting unit, 23: support, 24: head stage, 25: card holder,
25*a*: holding hole, 26: probe card, 29: wafer alignment camera, 30: lifting stage,
31: needle alignment camera, 32: cleaning plate, 34: temperature sensor, 35: probe needles,
38: alignment data measuring unit, 39: storage unit, 40: controlling unit,
42: input data acquiring unit, 44: needle position acquiring unit, 46: predicting unit,
47: prediction model, 48: prediction model generating unit, 50: determining unit,
52: movement controlling unit, 56: teacher data, D: Euclidean distance, D1: chip size,
D2: wafer position, D3: camera relative distance, $D_{th}$: threshold value, MV: measured value,
P1 to P13: temperature measurement point, PV: predicted value, T1 to T13: temperature data,
W: wafer, WA: machine learning range

What is claimed is:

1. A prober controlling device for a prober including a wafer chuck configured to hold a wafer on which semiconductor chips are formed, a probe card having probe needles, a card holder configured to hold an outer periphery of the probe card and place the probe card opposite the wafer and a relative moving unit configured to move the wafer chuck relatively to the probe needles, the prober controlling device being configured to drive the relative moving unit to bring the probe needles into contact with the semiconductor chips, the prober controlling device comprising:

an input data acquiring unit configured to acquire input data including temperature data of at least one of the probe card and the card holder;

a predicting unit configured to predict a position of a tip end of a probe needle based on the input data acquired by the input data acquiring unit using a prediction model that receives input of the input data and outputs the position of the tip end of the probe needle; and a determining unit configured to determine whether or not to execute prediction by the predicting unit, based on input data used as teacher data for machine learning of the prediction model and the input data acquired by the input data acquiring unit, before the prediction by the predicting unit.

2. The prober controlling device according to claim 1, wherein the determining unit performs:

processing of calculating, for respective parameters of the input data, differences between the input data acquired by the input data acquiring unit and the input data used as the teacher data; and processing of calculating root sum squares of the differences for respective parameters, and determining whether or not to execute the prediction by the predicting unit based on whether or not at least one of the root sum squares of the differences for respective parameters is in a predetermined certain range.

3. The prober controlling device according to claim 1, comprising:

a needle position acquiring unit configured to acquire the position of the tip end of the probe needle in a case in which the determining unit determines not to execute the prediction; and a relearning unit configured to perform relearning of the prediction model using the teacher data to which the input data acquired by the input data acquiring unit and the position of the tip end of the probe needle acquired by the needle position acquiring unit are added, wherein the needle position acquiring unit, the relearning unit, the input data acquiring unit and the determining unit are repeatedly operated until the determining unit determines to execute the prediction.

4. The prober controlling device according to claim 3, wherein the relearning unit excludes, from the teacher data, an oldest input data and the position of the tip end of the probe needle corresponding to the oldest input data, and then executes relearning of the prediction model based on the teacher data.

5. The prober controlling device according to claim 1, wherein in a case in which the determining unit determines to execute the prediction, the predicting unit predicts the position of the tip end of the probe needle, and the prober controlling device further comprises a movement controlling unit configured to control the relative moving unit based on the position of the tip end of the probe needle predicted by the predicting unit, so as to bring the probe needle into contact with a semiconductor chip.

6. The prober controlling device according to claim 1, wherein the input data acquiring unit acquires, in addition to the temperature data as the input data, alignment data including at least one of: a chip size of a semiconductor chip, a position of the wafer, and a positional relation between a first camera used to detect the semiconductor chip and a second camera used to detect the probe needle.

7. A prober comprising:

a wafer chuck configured to hold a wafer on which semiconductor chips are formed;

a probe card having probe needles;

a card holder configured to hold an outer periphery of the probe card and place the probe card opposite the wafer;

a relative moving unit configured to move the wafer chuck relatively to the probe needles; and the prober controlling device according to claim 1.

8. A prober controlling method for a prober including a wafer chuck configured to hold a wafer on which semiconductor chips are formed, a probe card having probe needles, a card holder configured to hold an outer periphery of the probe card and place the probe card opposite the wafer and a relative moving unit configured to move the wafer chuck relatively to the probe needles, the prober controlling method of driving the relative moving unit to bring the probe needles into contact with the semiconductor chips, the prober controlling method comprising:

an input data acquiring step of acquiring input data including temperature data of at least one of the probe card and the card holder;

a predicting step of predicting a position of a tip end of a probe needle based on the input data acquired in the input data acquiring step using a prediction model that receives input of the input data and outputs the position of the tip end of the probe needle; and a determining step of determining whether or not to execute the predicting step, based on input data used as teacher data for machine learning of the prediction model and the input data acquired in the input data acquiring step, before the predicting step.

* * * * *